United States Patent [19]

Abbas et al.

[11] 3,836,992

[45] Sept. 17, 1974

[54] ELECTRICALLY ERASABLE FLOATING GATE FET MEMORY CELL

[75] Inventors: Shakir A. Abbas; Conrad A. Barile; Ralph D. Lane, all of Wappingers Falls; Peter T. Liu, Beacon, all of N.Y.

[73] Assignee: International Business Machines Corporation, Armonk, N.Y.

[22] Filed: Mar. 16, 1973

[21] Appl. No.: 341,814

[52] U.S. Cl. .................................... 357/23, 357/41

[51] Int. Cl. .......................................... H01l 11/14

[58] Field of Search ..................... 317/235 B, 235 G

[56] References Cited

UNITED STATES PATENTS

| | | | |
|---|---|---|---|
| 3,660,819 | 2/1972 | Bentchkowsky | 317/235 R |
| 3,728,695 | 3/1973 | Bentchkowsky | 340/173 R |
| 3,728,695 | 4/1973 | Frohman-Bentchkowsky | 317/235 |
| 3,755,721 | 8/1973 | Bentchkowsky | 317/235 R |
| 3,774,036 | 7/1973 | Bentchkowsky | 340/173 R |
| 3,774,087 | 11/1973 | Pepper | 317/235 R |

FOREIGN PATENTS OR APPLICATIONS

| | | | |
|---|---|---|---|
| 2,201,028 | 8/1972 | Germany | 317/235 |

*Primary Examiner*—Martin H. Edlow
*Attorney, Agent, or Firm*—Robert J. Haase

[57] ABSTRACT

A read-mostly memory cell is disclosed comprising a floating gate avalanche injection field effect transistor storage device equipped with an erasing electrode. The memory portion of the erasable storage devices comprises a P channel FET having a floating polycrystalline silicon gate separated from an N-doped substrate by a layer of silicon dioxide. The erasing portion of the device comprises an erasing electrode separated from the polycrystalline silicon floating gate by a thermally grown layer of silicon dioxide having a leakage characteristic which is low in the presence of low electrical fields and high in the presence of high electrical fields. The floating gate is heavily doped with boron which also partially dopes the thermally grown silicon dioxide layer. The floating gate is charged negatively by avalanche breakdown of the FET drain while the erase gate is grounded to the substrate. The floating gate is discharged (erased) upon the application of a positive pulse to the erase electrode with respect to the semiconductor substrate causing electrodes on the charged floating gate to leak through the thermal oxide to the erasing electrode.

6 Claims, 3 Drawing Figures

ELECTRICALLY ERASABLE FLOATING GATE FET MEMORY CELL

BACKGROUND OF THE INVENTION

1. Field of the Invention

The present invention generally relates to floating gate avalanche injection field effect transistor storage devices and, more particularly, to such a device equipped with an erasing electrode overlying and separated from the floating gate by an electrical insulating layer.

2. Description of the Prior Art

As is well understood, a floating gate avalanche-injection field effect transistor device typically comprises an N doped silicon substrate in which a pair of spaced heavily doped P-type impurity regions are formed defining source and drain. An oxide layer is placed over the substrate extending between the source and drain in the channel region and constitutes the FET gate dielectric material. The floating gate electrode comprises pyrolytically deposited polycrystalline silicon which is rendered conductive by a heavy P-type impurity concentration preferably made by diffusion simultaneously with the formation of the source and drain.

The floating gate is charged negatively (to store the binary datum 1) upon the application of a reverse biasing potential on the FET drain with respect to the semiconductor substrate sufficient to avalanche the junction. The avalanching produces hot electrons at the interface between the substrate and the gate dielectric layer under the floating gate. The hot electrons are injected into and flow through the gate dielectric material and are finally trapped by the floating gate.

When a sufficient negative charge is accumulated on the floating gate, a conductive inversion layer is induced in the channel region of the FET underlying the gate dielectric. The presence of the inversion layer (and, hence, the stored binary datum 1) is sensed by applying a potential difference across the FET source and drain and detecting the flow of drain current. The floating gate normally is discharged (the stored binary datum is erased) by ultraviolet or x-ray irradiation which imposes significant limitations on the number of practical applications of the storage device.

In order to avoid the handicap of irradiation erasure of the above described storage device, proposals have been made for the electrical erasure of the charged floating gate. Three techniques are disclosed in the article entitled "MOS Memories Can Be Reprogrammed Electrically," on pages 112 and 113 of the Sept. 27, 1971 issue of Electronics. In one case, erasure is accomplished by the injection of hot electrons near the pinch off point in the conducting channel of the FET and injecting the hot electrons through the gate dielectric to neutralize the positively charged floating gate. In a second example, a negatively charged floating gate is erased by avalanche injection of hot holes from the substrate. The third technique requires the avalanche breakdown of both the source and drain of the FET in the presence of a negative potential applied to an erase electrode over the floating gate causing the injection of holes from the substrate through the gate dielectric to neutralize electrons in the charged floating gate. In each of the aforedescribed prior art techniques, the required erase circuitry is unnecessarily complicated in that the FET channel must be made conductive or one or both of the FET source and drain junctions are avalanched with the concomitant expenditure of an undesirable amount of power.

SUMMARY OF THE INVENTION

In accordance with the present invention, electrical erasure of a charged floating gate avalanche injection field effect transistor device is accomplished by the selectively controlled leakage conduction of trapped electrons on the floating gate to an overlying erase electrode through an intervening insulating layer. The leakage through the insulating layer is controlled by the amplitude of a potential difference applied between the erase electrode and the field effect transistor substrate. The characteristic of the insulating layer is that low leakage occurs with low potential difference during the time that data is to be retained and high leakage occurs with high potential difference when fast erasure is desired. In a preferred embodiment, the insulating layer is silicon dioxide which is thermally grown on a heavily boron-doped polycrystalline silicon floating gate whereby the silicon dioxide also becomes boron doped.

DESCRIPTION OF THE PREFERRED EMBODIMENT

Figure 1:
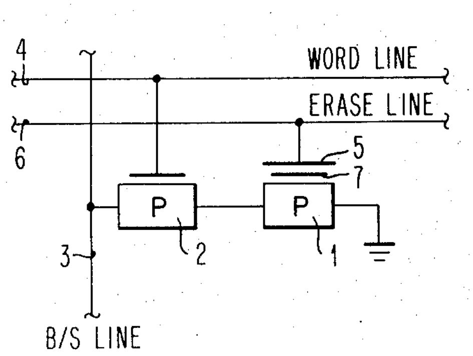
FIG. 1 is a simplified schematic circuit of a memory array cell application of the present invention.

The memory cell of FIG. 1, which is a single unit of an array of such cells, comprises an electrically erasable avalanche injection field effect transistor device 1 connected in series circuit with FET accessing switch 2 between bit-sense line 3 and ground. The gate electrode of switch 2 is connected to word line 4. The upper (erase) gate electrode 5 of device 1 is connected to erase line 6. Switch 2 and device 1 are P-channel FETs. The binary datum 1 is written into device 1 by simultaneous application of a negative potential to line 3 and a negative potential to line 4. In the preferred embodiment to be described later with reference to FIG. 2, minus 30 volt pulses from about 10 to about 100 microseconds duration are applied to bit-sense line 3 and to word line 4 for this purpose.

Switch 2 acts as a source-follower FET in response to the applied negative voltage pulses and charges the drain of device 1 to which it is directly connected to a negative potential sufficient to avalanche the P+ drain junction of device 1 with respect to the grounded substrate. Floating gate 7 of device 1 initially is at ground potential and functions as a field relief electrode to reduce the surface breakdown voltage of the drain junction. The avalanche breakdown of the drain junction causes hot electrons to occur at the substrate surface which are injected through the gate insulating layer separating floating gate 7 from the substrate. These injected electrons make their way via conduction through the gate oxide and are finally trapped by floating gate 7. The negative charge accumulated by the floating gate is a function of both the amplitude and the width of the pulse used in avalanching the P+ drain junction of device 1 and the leakage characteristic of the erasing dielectric which separates the floating gate from the upper gate electrode.

Figure 2:
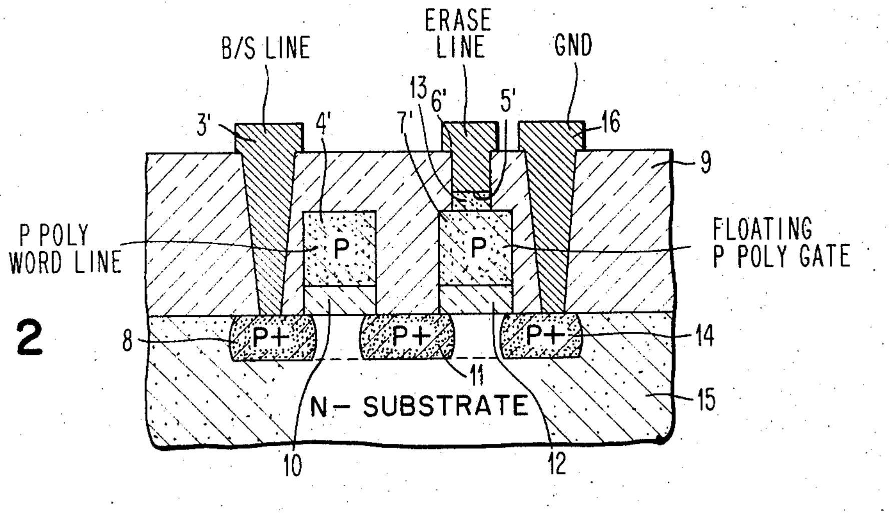
FIG. 2 is a cross sectional view of a preferred integrated circuit embodiment of the cell of FIG. 1.

Referring to FIG. 2, accessing switch 2 of FIG. 1 comprises P+ drain diffusion 8, P-doped polycrystalline silicon electrode and word-line 4', 800 A thermally grown silicon dioxide gate dielectric layer 10 and P-doped source diffusion 11. Bit-sense line 3' is connected to drain electrode 8. Lines 3' and 4' of FIG. 2 correspond to lines 3 and 4 of FIG. 1. Passivating silicon dioxide layer 9 completes the vertical structure.

The drain of device 1 and the source of switch 2 of FIG. 1 share P+ diffusion 11 of FIG. 2. As shown in FIG. 2, device 1 comprises P+ drain diffusion 11, floating P-doped polycrystalline silicon gate electrode 7', 800A thermal silicon dioxide gate dielectric layer 12, 1,000A P-doped thermally grown silicon dioxide layer 13, erase line 6' and P+ source diffusion 14 which is connected to ground via conductor 16. Both switch 2 and device 1 are formed on a common N-doped silicon substrate 15.

When enough negative charge is accumulated on floating gate 7' of FIG. 2 as discussed in connection with the writing operation of device 1 of FIG. 1, the accumulated negative charge induces a conductive inversion layer connecting the source 14 and the drain 11 of the storage device. When the conducting channel is formed, a transverse fringing field is created near drain 11 providing an additional field for creating hot electrons. The number of hot carriers created is reduced as the floating gate 7' charges negatively, with increasing negative charge increasing the voltage required for avalanching the junction between drain 11 and substrate 15. A steady-state is reached when the drain 11 to floating gate 7' potential drops below about 10 volts in the example given. As previously mentioned, minus 30 volt pulses of about 10 to about 100 microseconds duration are applied to bit-sense line 3' and to word line 4' whereby P+ diffusion 11 is charged to about minus 25 volts causing the avalanche breakdown of the junction between source diffusion 11 and substrate 15 underneath floating gate 7'. Phosphorous implantation in the channel of the storage device adjacent diffusion 11 can be used to lower the potential required for avalanche breakdown. The width of the negative pulses simultaneously applied to bit-sense line 3' and to word-line 4' are restricted to values insufficient to allow the steady state condition to be reached in ordinary memory and array logic applications. In addition, experiments have shown that the floating gate 7' is clamped at about minus 10 volts by the field dependent P-doped oxide 13 between erase gate 5' and the floating gate 7'. Although the floating gate 7' can be overdriven to as much as minus 15 volts by larger amplitude or wider write pulses, the charge placed on floating gate 7' decays within a few minutes to about minus 10 volts.

Figure 3:
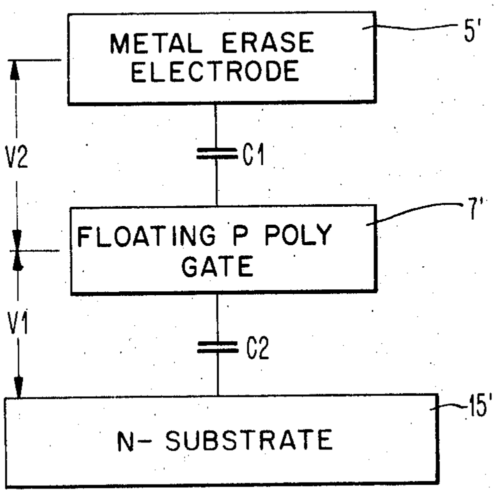
FIG. 3 is a simplified equivalent circuit diagram of the erase gate structure portion of FIG. 2.

Upon writing the binary datum 1 into the storage cell, a negative charge is trapped on floating gate 7'. The electrical erasure of the charge on floating gate 7' is accomplished by application of a positive voltage to erase gate 5' via erase line 6'. With reference to FIG. 3, if a positive voltage is applied to erase electrode 5', a voltage $V_2$ is impressed across C1 (formed by oxide 13 of FIG. 2) with respect to the floating gate which can be defined by the following equation:

$$V2 = V_{INITIAL} + C2/(C1 + C2)\ V_{APPLIED}$$

where $V_{INITIAL}$ is the stored potential at gate 7' and

C2 is formed by gate dielectric layer 12. If the geometry of the storage device is optimized by making the oxide area above floating gate 7' small with respect to the area of the oxide below floating gate 7' (C1 small relative to C2), the majority of the erase voltage ($V_{APPLIED}$) is impressed across the upper oxide 13 (C1) between the erase gate 5' and the floating gate 7'. The thermally grown erase oxide 13 is P-doped from the P-doped floating polycrystalline silicon gate 7' during the thermal oxide growth process by which it is formed. The P-doping of the erasing oxide 13 provides the erasing oxide with the unique characteristic of permitting low leakage currents at low fields (when data is desired to be stored) while permitting high leakage at high fields (when erasure of the stored data is desired.) During data retention, erase gate 5' is connected to ground potential. Erasure is accomplished by application of a +30 volt pulse of at least 1 millisecond and preferably of about 100 milliseconds duration to erase gate 5' to completely erase the negative charge on floating gate 7'.

Dielectric materials other than silicon dioxide have been considered for layer 13. Some evidence has been obtained indicating that oxynitride dielectrics may require lower erase voltages and provide better charge retention than doped silicon oxide. A layer of silicon nitride also appears to be useful in lieu of silicon oxide layer 13.

Based upon limited device experiments, the stored data retention time of structure similar to the one shown in FIG. 2 has been theoretically projected to be about 1 year at 85°C junction temperature. Some indication has been observed, however, that there is a limited number of complete cycles of device operation, i.e., iterations of writing and erasing, possible with the device of FIG. 2. No definite maximum limit has been measured as yet but it is believed that from about 100 to about 1,000 operational cycles are realizable using the same writing and erasing potentials. Thus, the structure of FIG. 2 is useful primarily in reading mostly memory applications where a limited number of electrical erasures is desired.

Semiconductor materials like silicon are characterized by the presence of a forbidden band gap between the conduction and valence bands. Electrons in the conduction band and holes in the valence band contribute to conduction phenomenon in the semiconductor. Under equilibrium conditions, the rate of generation and recombination are equal and the net effect is zero. However, under high field conditions in monocrystalline silicon, the electrons and holes can gain enough kinetic energy to be able to dislodge additional electrons and holes leading to a multiplication effect which in turn causes avalanche. In order to achieve avalanche, one must provide a strong electric field to produce a depletion layer at the surface of the monocrystalline silicon substrate. The surface region of the monocrystalline silicon substrate is depleted by applying an electric field normal to the surface in such a direction to cause the majority carriers to be removed from the surface. Normally, if enough minority carriers are generated, then the surface will become inverted and the surface potential is stabilized. However, if the applied field normal to the surface is large enough and of a very short duration, the field in the depletion region will rise to the critical value for avalanche and can cause conduction across the depleted region of the substrate and into any silicon oxide layer overlying the substrate. In the case of a P-doped monocrystalline silicon substrate having an overlying silicon oxide layer and being subjected to a high frequency sinusoidal excitation voltage electrons are injected into the silicon oxide layer during each positive half cycle of the sinusoidal voltage. The electrons are removed from the surface of the substrate during each negative half cycle.

Inasmuch as avalanche in the manner described above cannot occur in conductors (e.g., equi-potential surfaces) and considering that even lightly doped polycrystalline silicon is a conductor, one concludes that phenomena requiring a depletion region (such as the phenomenon of avalanche) does not occur in polycrystalline silicon material. Accordingly, the erasure of the negative charge placed on floating P-doped polycrystalline silicon gate 7' of FIG. 2 does not occur as a result of an avalanching phenomenon in the P-doped polycrystalline silicon material. Rather, it is believed and the experimental evidence corroborates that erasure is achieved simply by leakage conduction through silicon dioxide layer 13 to erase gate 5' when erase line 6' is pulsed positively with respect to substrate 15 as described above. Even if there is some tendency toward avalanching, the higher leakage of an oxide which is thermally grown on a polysilicon substrate such as oxide layer 13 which is grown on gate 7', will retard the buildup of the critical electricl field required across oxide layer 13 and gate 7' to cause avalanche within gate 7'.

While this invention has been particularly shown and described with reference to the preferred embodiments thereof, it will be understood by those skilled in the art that the foregoing and other changes in form and detail may be made therein without departing from the spirit and scope of the invention.

What is claimed is:

1. A memory cell comprising a monocrystalline semiconductor substrate of one conductivity type, a pair of surface impurity regions of the other impurity type in said substrate, a first insulating layer on said substrate extending between said regions, a boron doped polycrystalline semiconductor member on said first layer, a second insulating layer on said member, said second layer comprising boron doped silicon oxide characterized by lower leakage conduction at lower impressed electric field values and higher leakage conduction at higher impressed electric field values, a conductive electrode on said second layer, means for selectively reverse biasing at least one of said regions with respect to said substrate to cause avalanching of the junction between said one region and said substrate to charge said member, and means for applying a voltage pulse to said electrode relative to said substrate to cause leakage conduction through said second layer to discharge said member, the polarity of said voltage pulse on said electrode being opposite to the polarity of charge on said member.

2. The memory cell defined in clain 1 wherein said first layer is thermally grown silicon oxide.

3. The memory cell defined in claim 1 wherein said first layer is about 800A thick and said second layer is about 1,000A thick.

4. The memory cell defined in claim 1 wherein said voltage pulse is at least 1 millisecond in duration.

5. The memory cell defined in claim 1 wherein the capacitance of the capacitor formed by said electrode, said second layer and said member is smaller than the capacitance of the capacitor formed by said member, said first layer and said substrate.

6. The memory cell defined in claim 1 wherein said one conductivity is N-type.

* * * * *